United States Patent [19]
Robinson et al.

[11] Patent Number: 5,836,575
[45] Date of Patent: Nov. 17, 1998

[54] WAFER MANUAL HANDPICK STATION

[75] Inventors: Keith Robinson, Caldwell; Robert Villa, Boise, both of Id.

[73] Assignee: Micron Electronics, Inc., Nampa, Id.

[21] Appl. No.: 741,043

[22] Filed: Oct. 30, 1996

[51] Int. Cl.$^6$ ................................................. B65G 47/00
[52] U.S. Cl. .................. 269/317; 108/138; 108/150; 269/316; 414/935
[58] Field of Search ................ 108/5, 138, 150; 269/76, 81, 302, 316, 317; 414/935, 936, 941

[56] References Cited

U.S. PATENT DOCUMENTS

| | | | |
|---|---|---|---|
| 3,238,904 | 3/1966 | Hinko et al. | 108/5 X |
| 4,717,190 | 1/1988 | Witherspoon | 294/99.2 |
| 4,740,135 | 4/1988 | Shulenberger | 414/935 X |
| 4,887,904 | 12/1989 | Nakazato et al. | 414/936 X |
| 4,917,556 | 4/1990 | Stark et al. | 414/936 X |
| 5,046,909 | 9/1991 | Murdoch | 414/225 |
| 5,052,886 | 10/1991 | Moroi | 414/757 |
| 5,374,147 | 12/1994 | Hiroki et al. | 414/936 X |
| 5,474,641 | 12/1995 | Otsuki et al. | 156/345 |

*Primary Examiner*—Janice L. Krizek
*Attorney, Agent, or Firm*—Knobbe, Matens, Olson & Bear LLP

[57] ABSTRACT

A wafer stand for facilitating the inspection, testing, and handling of large-diameter silicon wafers, such as those having a diameter of 8 inches (200 mm), during semiconductor processing and assembly. The stand consists of a lower plate or pedestal, a plurality of adjustable legs mounted thereon, and an upper plate mounted on the upper end of the legs. The top plate has an access aperture of a diameter coinciding approximately with that of the wafer, and can be adjusted such that the attitude and/or height of the upper plate in relation to the pedestal can be varied. In one embodiment, the front leg of the stand may be removed to provide better access to the bottom of the wafer. The upper plate is also provided with a pair of parallel tracks into which a wafer mounting frame can be slid to position the wafer over the access aperture. The wafer stand is constructed so as to permit its temporary mounting to a workbench or table, yet is fully transportable by one person. Additionally, the stand is constructed in such a way as to minimize the potential for contamination of the mounted wafer during use or transport.

15 Claims, 8 Drawing Sheets

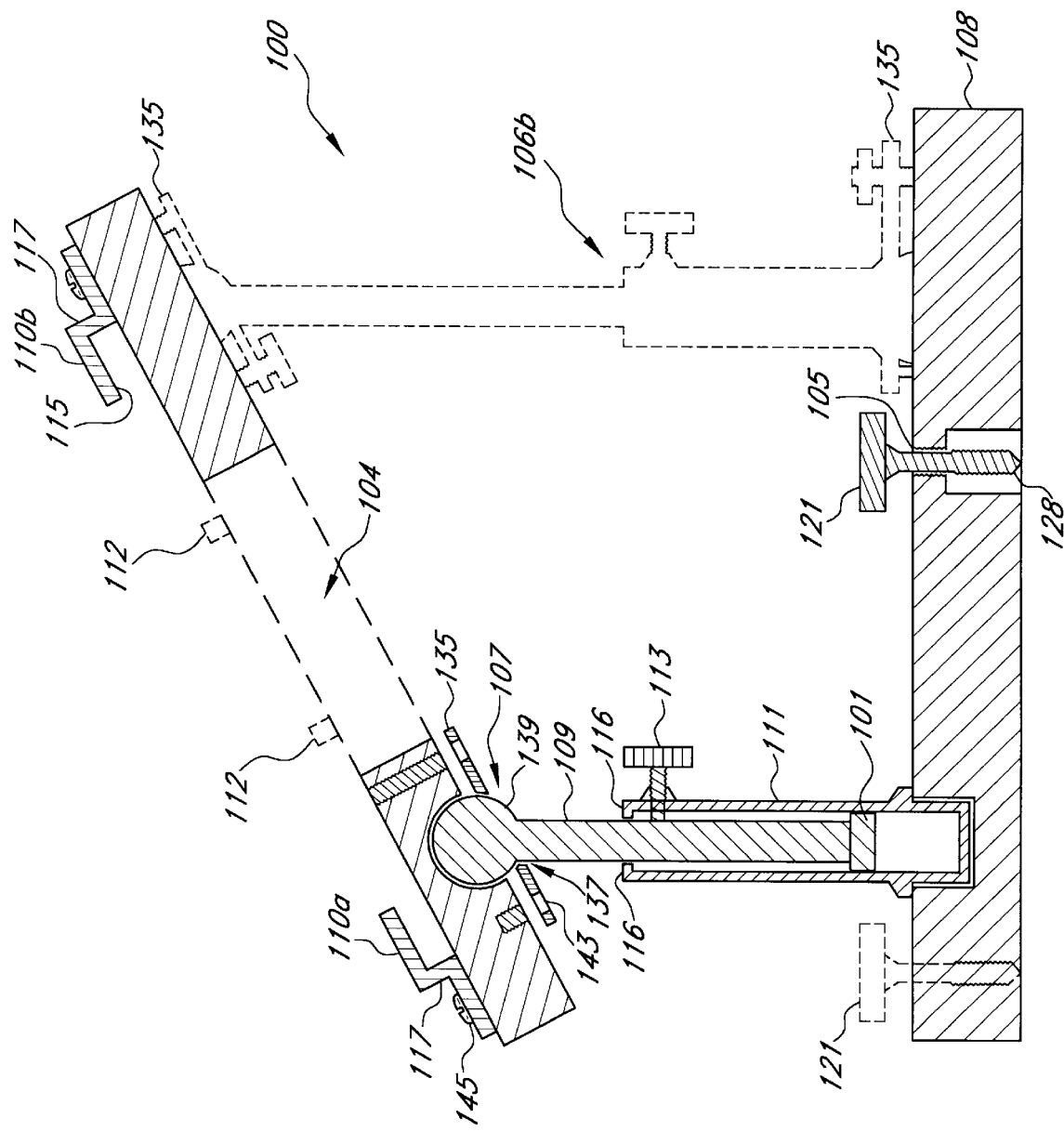

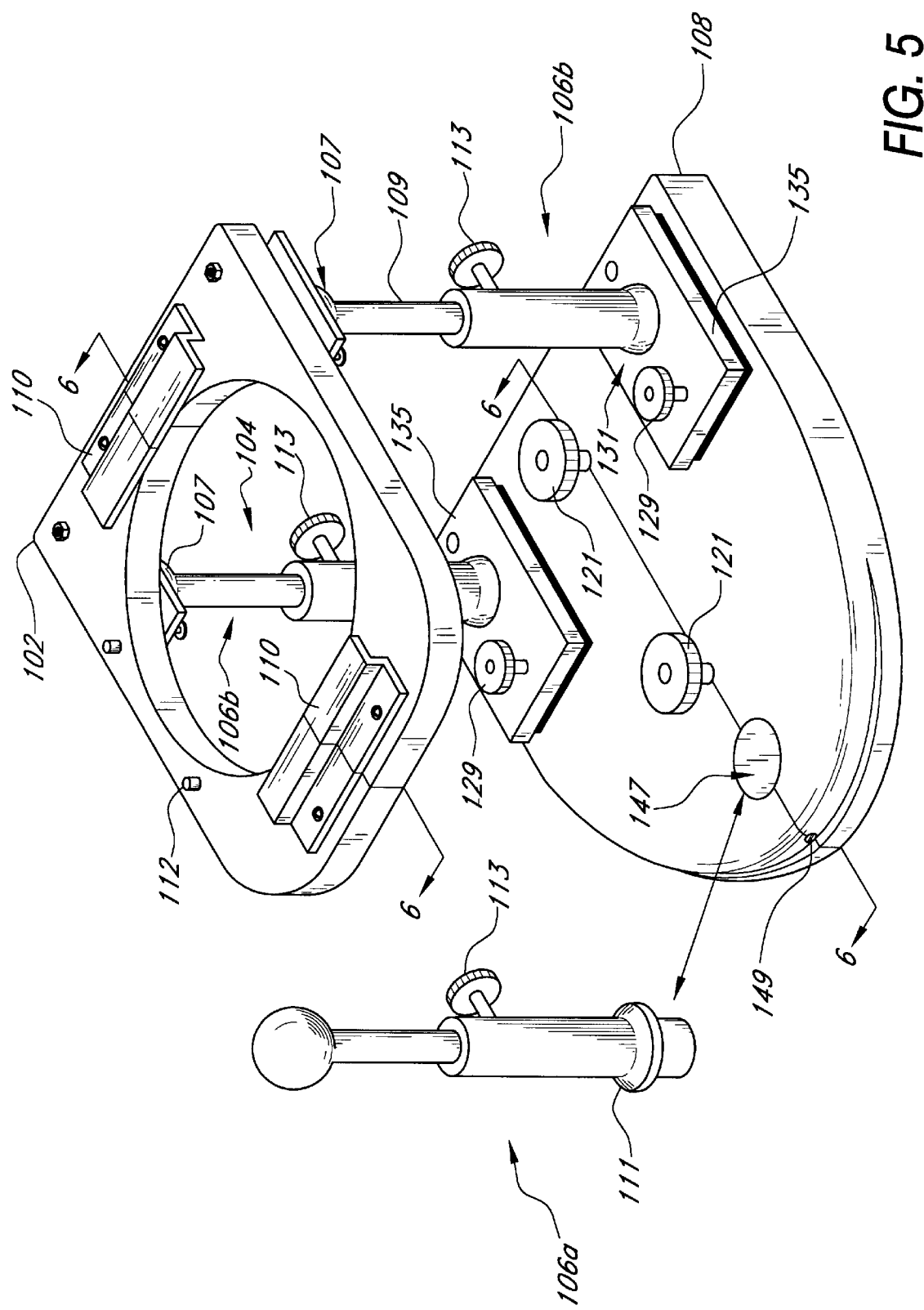

WAFER MANUAL HANDPICK STATION

BACKGROUND OF THE INVENTION

1. Field of the Invention

The present invention is related to the field of silicon wafer processing and semiconductor manufacturing technology. More specifically, the present invention is directed to a wafer stand for facilitating the inspection, testing, and handling of large silicon wafers.

2. Description of Related Technology

Numerous individual steps are involved in the manufacture and assembly of modern semiconductor devices. Many of these steps relate either directly or indirectly to the processing of silicon wafers of various sizes, and are to a large degree automated or performed by robotic means. Such automation and robotics obviates the need for human manipulation or handling of the wafers, and therefore potential damage or contamination of the semiconductor devices obtained therefrom (i.e., die). Some types of activities, however, such as research and development (R&D), die inspection during assembly, testing, and troubleshooting, are best performed (or may only be performed) manually in a benchtop environment. Frequently, such activities require one technician or engineer to manipulate small numbers of wafers, and output the die from those wafers onto a variety of different platforms such as gel packs, waffle packs, or sticky-backs, thereby making robotic or automated manipulation impractical. Hence, a means for positioning and restraining the wafer or other workpiece on a benchtop during such operations without damaging it or the die is needed.

Reference is now made to FIG. 1. Using existing methods of assembly processing, a wafer mounter or similar device is used to mount a single wafer 50 on tacky foil or polymer 54 with the die-side of the wafer 52 away from the foil. The mounted wafer and foil are secured in a metallic frame 56 such that a portion of the wafer 50 is suspended across the opening through the central portion of the frame. In this manner, the wafer 50 and frame 56 can often be readily handled by the operator with one hand 58. Smaller diameter (i.e., 6-inch or less) wafers are fairly easy to handle in this manner; such wafers can be placed in a mount and manipulated with one hand while operations such as die picking and placement are performed with the technician's free hand. Larger wafers do not lend themselves so easily to such handling arrangements. For example, 8-inch wafers, which have been increasingly adopted by the industry for the benefits derived from their inherent cost savings and manufacturing efficiency, have about 175% of the surface area of a 6-inch wafer, thereby significantly increasing the size and weight of any frame used to mount the wafer. As a result of this increased frame size and weight, the average-sized person can not adequately handle the larger wafer and frame assembly with one hand, thereby making the aforementioned R&D, inspection, testing, and output activities substantially more difficult for one person. Furthermore, many of these activities require the operator to maintain both hands free, a feature completely lacking from the current technique of wafer frame-mounting described above.

Various methods of handling and transporting silicon wafers during processing or assembly are disclosed in the prior art. For example, U.S. Pat. No. 5,474,641 discloses a wafer mounting stand having a holding mechanism. The mounting stand is connected with a mechanism for rotating the wafer (or other object) to be processed so that the wafer can be placed in various rotational orientations around one axis with respect to the stand. This mounting stand is designed for use within the processing chamber disclosed in the patent, and includes a mechanism with stepper motor for varying the orientation of the wafer remotely while the stand is located within the chamber. In this regard, the mounting stand is not well suited for use outside of the processing chamber in that rotation of the wafer held in the stand could occur when the stand is decoupled from the motor drive. More particularly, the wafer could tend to rotate or "freewheel" when torque acts on the wafer holder portion shaft(s), such as that resulting from picking and/or placing die on the wafer away from the shaft centerline. Furthermore, the support posts of the stand must be moved radially to allow removal or changing of the wafer being held, thereby greatly increasing the difficulty associated with using the device. Additionally, no facility is disclosed for mounting the stand to a structure such as a bench or table for stability.

U.S. Pat. No. 5,046,909 discloses a ring device for handling semiconductor wafers during processing. This device allows the transport of one wafer between processing stations by robotic arm without human handling, and provides access to both the top and bottom surfaces of the wafer. However, the ring device is not amenable to bench-top use, since no means of support for such uses is disclosed. The ring device could be held in one hand by the operator; however, with larger 8-inch wafers, such arrangements have proven to be unwieldy as previously described, and have the inherent disability of allowing the operator the use of only his/her one free hand.

U.S. Pat. No. 4,717,190 discloses a wafer handling and placement tool which allows the operator to pick up and hold a wafer with the tool using one hand. This tool is primarily for transferring wafers from one location to the other, and in this regard has the limitations of not allowing the operator use of both hands while performing operations relating to the wafer. Furthermore, the engagement area of the tool against the wafer is small such that incidental lateral forces exerted on the wafer (i.e., along the edges of the wafer not held by the tool) could potentially unseat the wafer from the tool and result in damage.

U.S. Pat. No. 5,052,886 discloses a pick-up device for use in conjunction with a robotic arm during wafer handling and processing. This device uses a top and bottom plate with two posts interposed therebetween, with the device being free to move with relation to the robotic arm to allow uniform contact between the top of a silicon wafer and the bottom surface of the bottom plate. This device is not amenable to benchtop use or transport, in that it requires the use of a vacuum to pick up the wafer, and is designed to be received in the robotic arm. Furthermore, no adjustment of the relationship of the top and bottom plates is permitted, and no means of simultaneous access to both sides of the wafer is provided.

Based on the foregoing, it would be most desirable to provide an improved wafer stand for securely holding large-diameter mounted silicon wafers, such as those having diameters greater than 6 inches and including those having an 8-inch (200 mm) diameter, during research, testing, or inspection without the need for user assistance or intervention. The improved apparatus would be mechanically stable yet easily relocated by one person, and would allow adjustment of the position of the wafer for optimal access to both sides of the wafer simultaneously. Furthermore, the apparatus would permit easy wafer mount insertion and removal, yet hold the wafer mount securely during manipulation or transport. Finally, the apparatus would be constructed in such a fashion as to minimize the potential for any contamination of the wafer or die during manipulation, wafer mount insertion and removal, and apparatus transport.

SUMMARY OF THE INVENTION

The present invention satisfies the aforementioned needs by providing an improved apparatus for handling and manipulating large semiconductor wafers and their mounts during research, testing, or similar activities, the apparatus also being adjustable to meet the needs of the individual user.

In a first aspect of the invention, a benchtop manual wafer handpick station is provided which allows the user to perform a variety of activities relating to large diameter wafer assembly and processing which require the use of two hands. The station includes a top plate with a central access hole to allow simultaneous access to both the front and back (i.e., die and non-die sides) of the wafer while holding it securely in place. A pair of parallel tracks with retaining pins are mounted on the upper surface of the top plate so that a mounted wafer, such as that shown in FIG. 1, can be easily slid into the tracks and locked into place in order to maintain it in position relative to the access hole.

In a second aspect of the invention, the aforementioned top plate is movably mounted to the base or pedestal portion of the apparatus such that the attitude and height of the top plate in relation to the pedestal is variable. This allows the apparatus to be adjusted to the needs of the individual process and/or user.

In a third aspect of the invention, the station is constructed and sized so that it may be readily moved from one location to another by the user. The station has the facility to be rigidly mounted to the benchtop or support table during periods of use so as to avoid any undue shifting or movement, yet rapidly dismounted for transport. Additionally, the station is constructed of metallic components which minimize the potential for contamination of the surfaces of the wafer due to foreign material carried on or produced by the station.

BRIEF DESCRIPTION OF THE DRAWINGS

FIG. 4a is crossectional illustration of the first preferred embodiment of the invention, taken along line 4—4 of FIG. 2.

FIG. 5 is a perspective view of a second preferred embodiment of the wafer handpick station of the present invention.

DETAILED DESCRIPTION OF THE PREFERRED EMBODIMENT

Reference is now made to the drawings wherein like numerals refer to like parts throughout.

Figure 1:
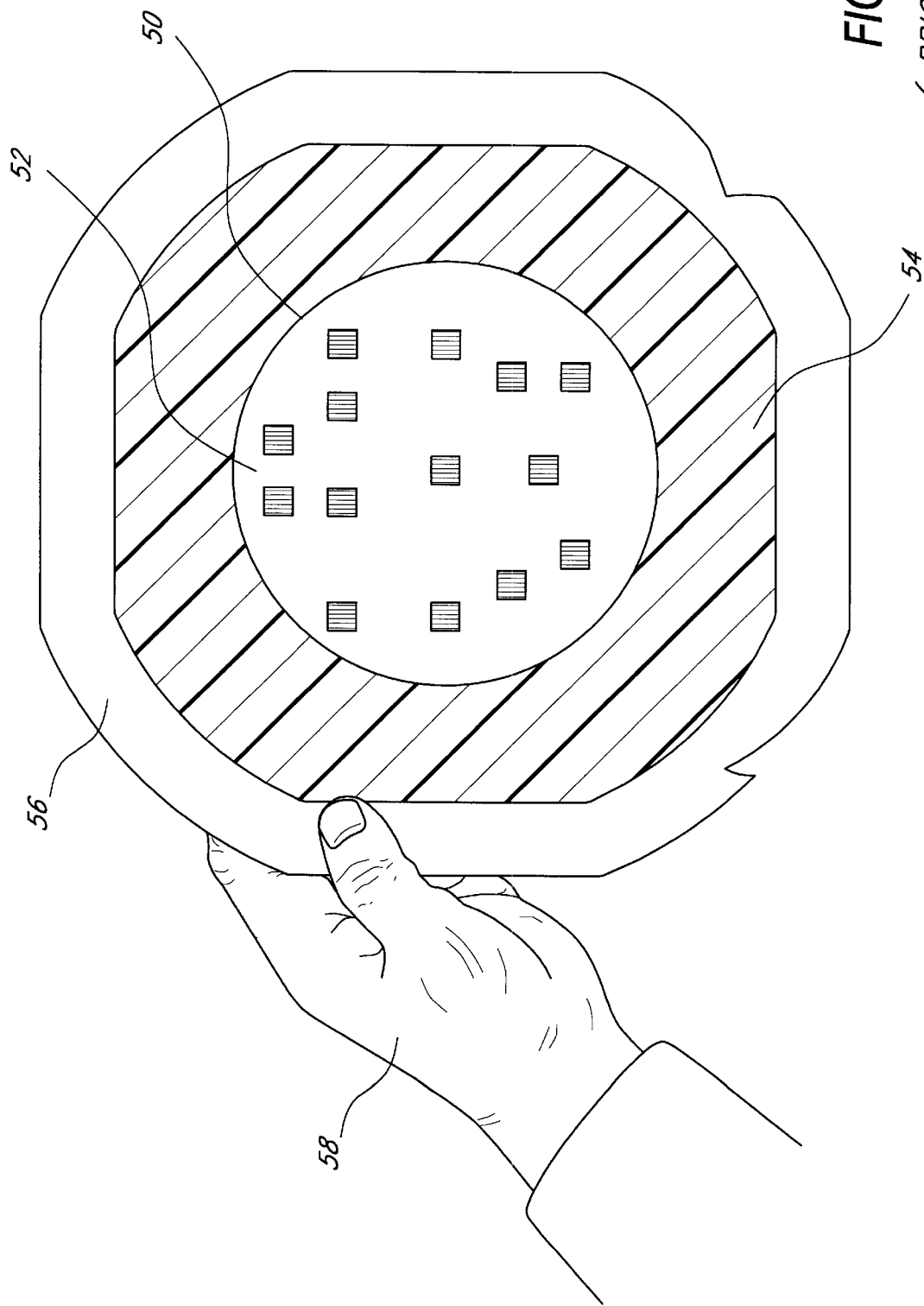
FIG. 1 is a perspective view of a prior art wafer mount apparatus used to handle wafers during processing and assembly.
Figure 2:
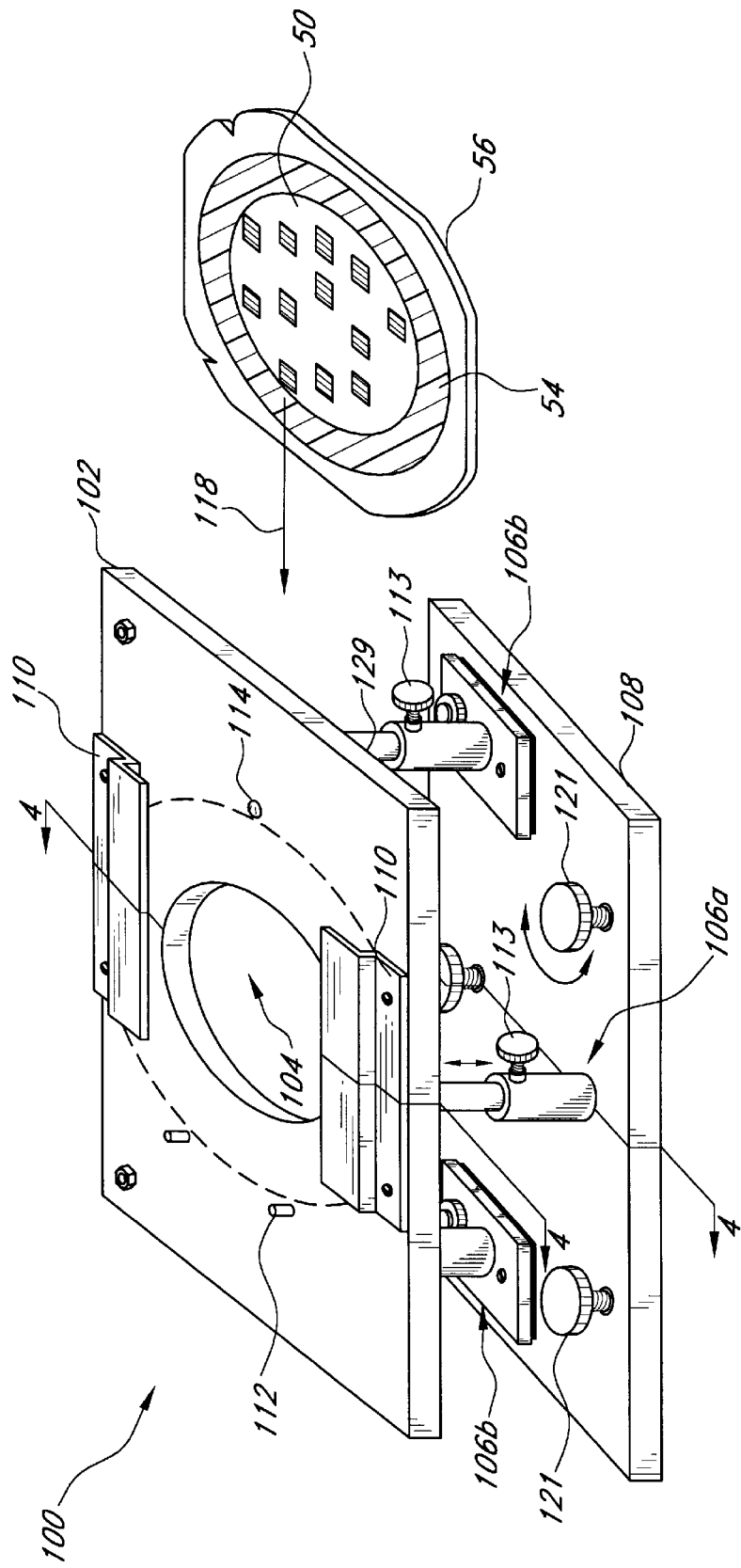
FIG. 2 is a perspective view of a first preferred embodiment of the wafer handpick station of the present invention.

A first preferred embodiment of the wafer handpick station of the present invention is shown in FIG. 2. In that embodiment, a wafer handpick station 100 is generally comprised of a top plate 102 having an aperture or wafer access hole 104 extending through a central portion thereof, a bottom plate or pedestal 108, and a plurality of support legs 106a, 106b extending downwards from respective connecting points on the bottom side of the top plate 102 to connecting points located on the pedestal 108. A wafer positioning mechanism (sliding tracks 110) is mounted on the top plate 102 in relative position to the access hole 104. Stop pins 112 and retaining mechanism 114 act to limit the lateral travel of a wafer mount frame 56 in the retaining tracks 110. Thumbscrews 113, 129 permit height and angle adjustment of the legs, respectively, while a plurality of securing screws 121 located on and penetrating through the pedestal 108 allow mounting of the station 100 to a benchtop or table.

A wafer mount frame 56 containing a wafer 50 is mounted in the handpick station 100 by placing the frame essentially flat on the top surface of the top plate 102 to the right of the access hole 104. By sliding the frame 56 towards the hole 104 in the direction 118 indicated in FIG. 2, the frame will engage the sliding tracks 110 and ultimately encounter the stop pins 112, thereby positioning it such that the geometric center of the wafer 50 will be substantially coincident with the geometric center of the access hole 104. When the frame 56 reaches the stop pins 112, retaining mechanism 114 engages to retard movement of the frame laterally out of the sliding tracks 110. Wafer access hole 104 is substantially circular in crossection and is sized to provide the operator with pass-through access to substantially all of the rear of the mounted wafer 50, yet prevent the frame 56 from passing through the hole 104.

Figure 3:
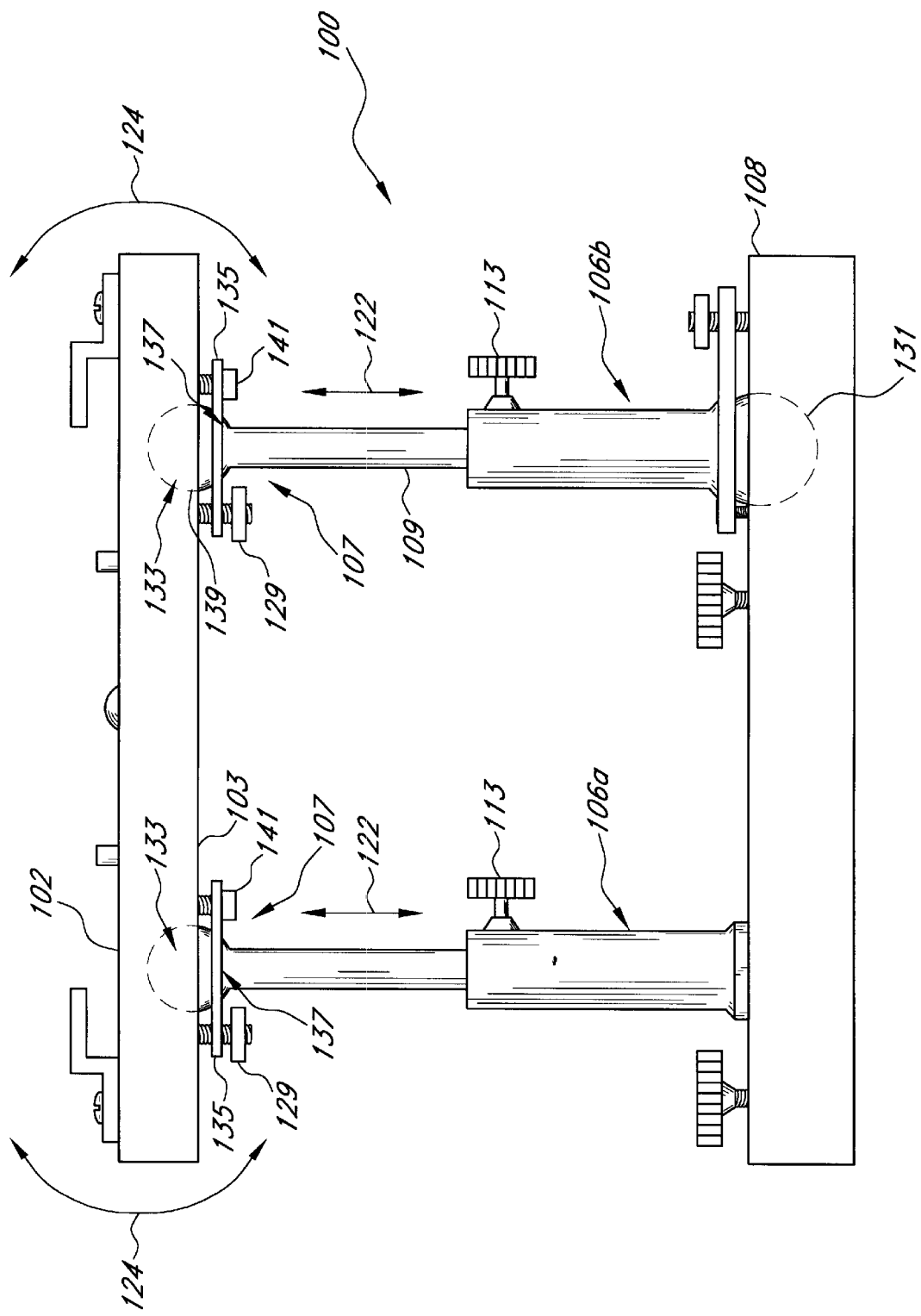
FIG. 3 is a side elevation view of the first preferred embodiment of FIG. 2, showing the movement of the top plate and legs in relation to the pedestal.

In the first preferred embodiment, three support legs 106 which extend downward from connecting points on the top plate to similar points on the pedestal 108 are provided. Referring now to FIG. 3, the front leg 106a and both of the rear legs 106b are adjustable in the height dimension 122, and articulate in relation to the top plate. Additionally, the rearward two legs 106b articulate with respect to the pedestal 108 by virtue of pedestal joints 131. The construction of these joints will be described in detail below. This height adjustability and angular articulation 124 allow the top plate 102 and front and rear legs 106a, 106b to be placed in a variety of orientations with respect to the pedestal 108, thereby maximizing flexibility and operator access to the back side of a wafer 50 mounted in the handpick station 100. The legs are arranged in a triangular pattern on the pedestal 108 so as to provide adequate support and stability for the top plate 102 through the full range of adjustment of legs 106a, 106b.

Figure 4B:
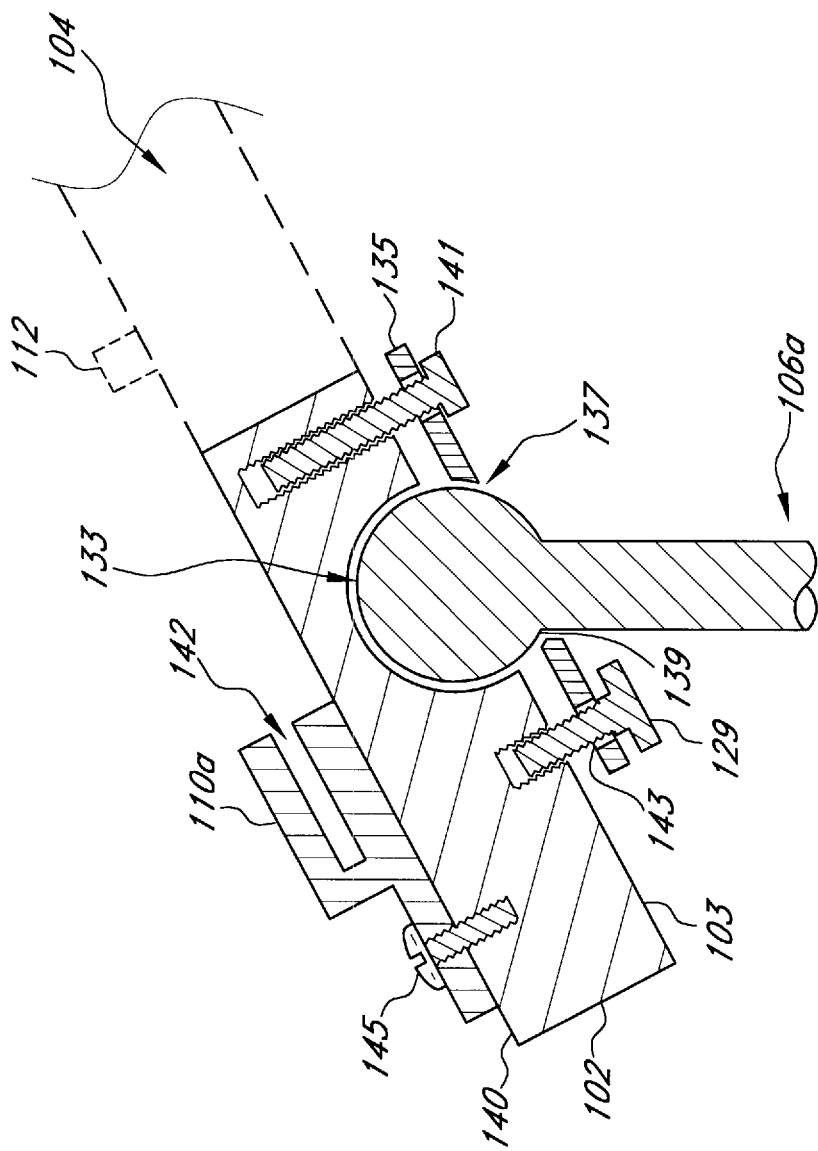
FIG. 4b is partial crossectional illustration of the present invention, showing a second preferred embodiment of the wafer sliding track and stop pins.

Articulation of the legs with respect to the top plate 102 is accomplished through the use of pivoting top plate ball joints 107 on the tops of each leg mounted and received within recesses 133 within the bottom surface 103 of the top plate 102, as shown in FIGS. 3 and 4a. A ball retaining plate 135 having a chamfered hole 137 receives the ball portion 139 of its respective leg 106a, 106b and retains the ball portion 139 within the recess 133 by way of threaded fasteners 141 and joint thumbscrews 129. The threaded fasteners 141 are received by the retaining plate 135 and top plate 102 so as to provide leverage against the countervailing force of the respective joint thumbscrew 129, which penetrates through a hole 143 (FIG. 4a) in the retaining plate and is threadedly received by the top plate 102. As shown in FIG. 4b, the ball portion 139 of the leg acts as a fulcrum for the retaining plate 135, with the joint thumbscrew 129 and the threaded fastener 141 opposing each other. In this fashion, the operator may loosen a given joint thumbscrew 129 to allow articulation of its respective leg 106a, 106b with relation to the top plate 102, and then subsequently retighten the thumbscrew 129 to lock the leg 106a, 106b in a desired position. The construction and operation of the pedestal joints 131 are completely analogous to that of the top plate joints 107 previously described. Alternatively, other comparable mechanical joints such as Heim joints or pivot pins may be used for articulation of the legs, depending on the needs of the individual user.

Height adjustment of the legs is accomplished by way of a friction thumbscrew arrangement 113 on each leg, as shown in FIG. 4a. In the first preferred embodiment, each of the legs 106a, 106b comprise a sliding tube and sleeve type arrangement, where the upper (tube) portion of the leg 109 is received by and slides within the lower (sleeve) portion 111 such that the overall length of each leg may be varied independently. A stop 101 is attached to the lower end of upper portion 109 of each leg 106a, 106b so that the leg portions will not separate when maximum extension is reached; the stop 101 will engage the top section 116 of the lower sleeve portion 111 of its respective leg. Top section 116 also acts to laterally stabilize the upper leg segment 109 with respect to the lower sleeve 111 to maximize the stability of the top plate 102 during use. The thumbscrew 113 is threadedly received by the lower leg sleeve 111 and is manually tightened to provide transverse force and friction against the upper leg portion 109 to restrict its motion within the lower leg sleeve 111. It can be appreciated that a large variety of alternative designs can be used to effectuate the aforementioned height functionality of the handpick station support legs 106a, 106b.

Optionally, securing mechanisms 121 may be provided as shown in FIG. 4a to facilitate mounting the pedestal 108 of the station 100 to a bench or table top in order to maximize stability. Using these mechanisms, the operator may rapidly mount or dismount the station 100 from the bench as desired. In one preferred embodiment, the securing mechanisms 121 are coarse-pitch threaded thumbscrews, the threaded portion 128 of which is received by the table top or bench to which the station 100 is to be mounted. The thumbscrews pass through holes 105 in the pedestal 108 which are threaded and sized so as to retain the thumbscrews from falling out during station transport. Alternatively, other types of quick-release mechanisms may be employed as desired with equal success.

Two sliding track elements 110a, 110b are mounted to the upper surface 140 of top plate 102 and are constructed with a step-shaped crossection of sufficient height to permit a single wafer mount frame 56 to just slide between the upper surface 140 and the bottom surface of the sliding track step 115 without undue friction. The track elements 110a, 110b are mounted in substantially parallel fashion to the top plate 102 such that the distance between the vertical portion 117 of each step in both sliding track elements 110a, 110b is slightly larger than the diameter of the wafer mount frame (typically about 10.5 inches for a 8-inch diameter wafer). The elements may be mounted using any number of conventional fastening methods such as threaded fasteners 145 or welding, although other means may be utilized. Welding minimizes the potential for contamination being captured in and/or generated by the threads of the fasteners, yet does not allow for easy removal or adjustment. The track members 110a, 110b are sized to be of sufficient length to retain the frame 56 in position over the access hole 104 while allowing a minimum of rotation of the wafer 50 out of the plane of the top plate 102. In this manner, any pressure placed on the back of the wafer 50 by the operator when the frame is captured in the sliding tracks 110 will result in a minimum of dislocation of the wafer and frame, thereby maximizing stability. Alternatively, the sliding tracks 110 may be constructed with a separate groove 142 in each (FIG. 4b) to receive the diametrically opposed edges of the wafer mount frame 56 in the bottom and top track elements 110a, 110b, respectively, without contacting the upper surface 140 of the top plate 102.

Figure 4C:
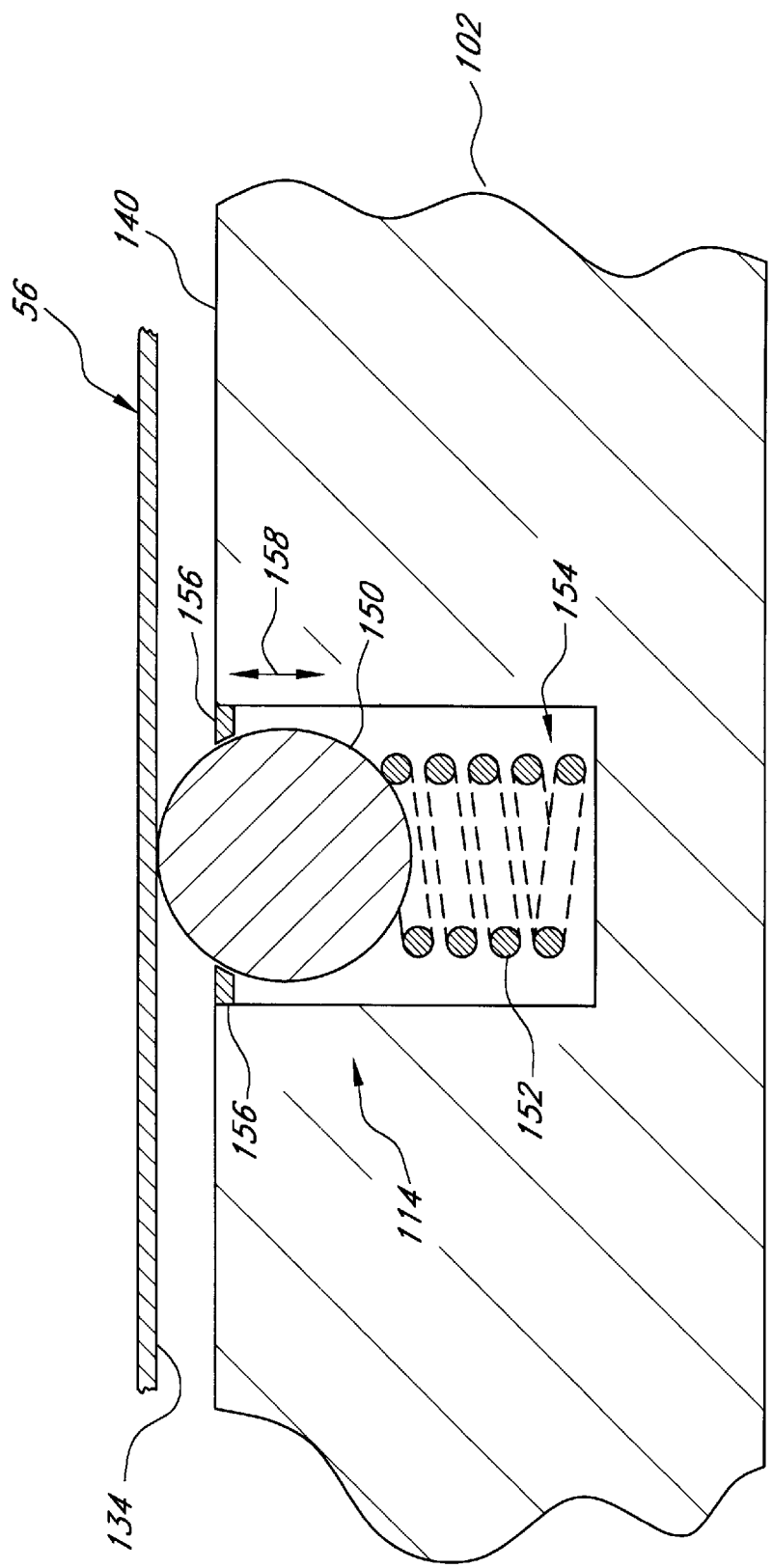
FIG. 4c is a partial crossectional illustration of a first embodiment of a ball-and-spring wafer retaining device.

Stop pins 112 are positioned on the top plate 102 to limit the transverse travel of the frame 56 in the sliding tracks during insertion to further facilitate this alignment. These pins are of sufficient height to engage the edge of a frame traveling in tracks 110, and may be constructed in a number of different ways well understood in the mechanical arts, such as being threaded into tapped holes made in the upper surface 140 of the top plate 102, or machined directly therefrom. A plurality of pins may be placed in circumferential fashion around the periphery of the access hole 104 so as to simultaneously engage various portions of the edge of the frame 56, or alternatively a single pin may be used for this purpose. Additionally, one or more retaining devices 114 (FIG. 4c) may be provided in the upper surface 140 of the top plate 102 to prevent the frame from sliding out after being inserted in the tracks 110. In one embodiment, the retaining devices 114 are spring-loaded nylon balls 150 recessed into and captured within the top plate 102 at a depth sufficient to engage the near edge of the frame 56 and prevent the wafer mount from sliding laterally. These retaining devices are constructed with springs 152 of very low force constant and are positioned such that no adverse effects on the wafer 50, foil 54, or frame 56 result from engagement of the bottom of these components with the retaining device 114 during frame insertion or removal. The ball 150 and spring 152 are received within the recess 154 in the top plate 102 and retained within the recess by a retaining ring 156 such that the extension of the ball above the upper surface 140 of the top plate 102 is limited to a predetermined distance. The ball 150 is free to translate within the recess in the direction shown by arrow 158. It can be appreciated, however, that a variety of different mechanisms and/or materials may be used with equal effectiveness to retain the frame in position within the sliding tracks 110 after insertion. Alternatively, the sliding track elements 110a, 110b may be constructed so as to provide a frictional fit between the elements, frame 56, and top plate 102 such that friction retains the frame 56 in alignment without the need for a retaining mechanism 114.

Figure 6:
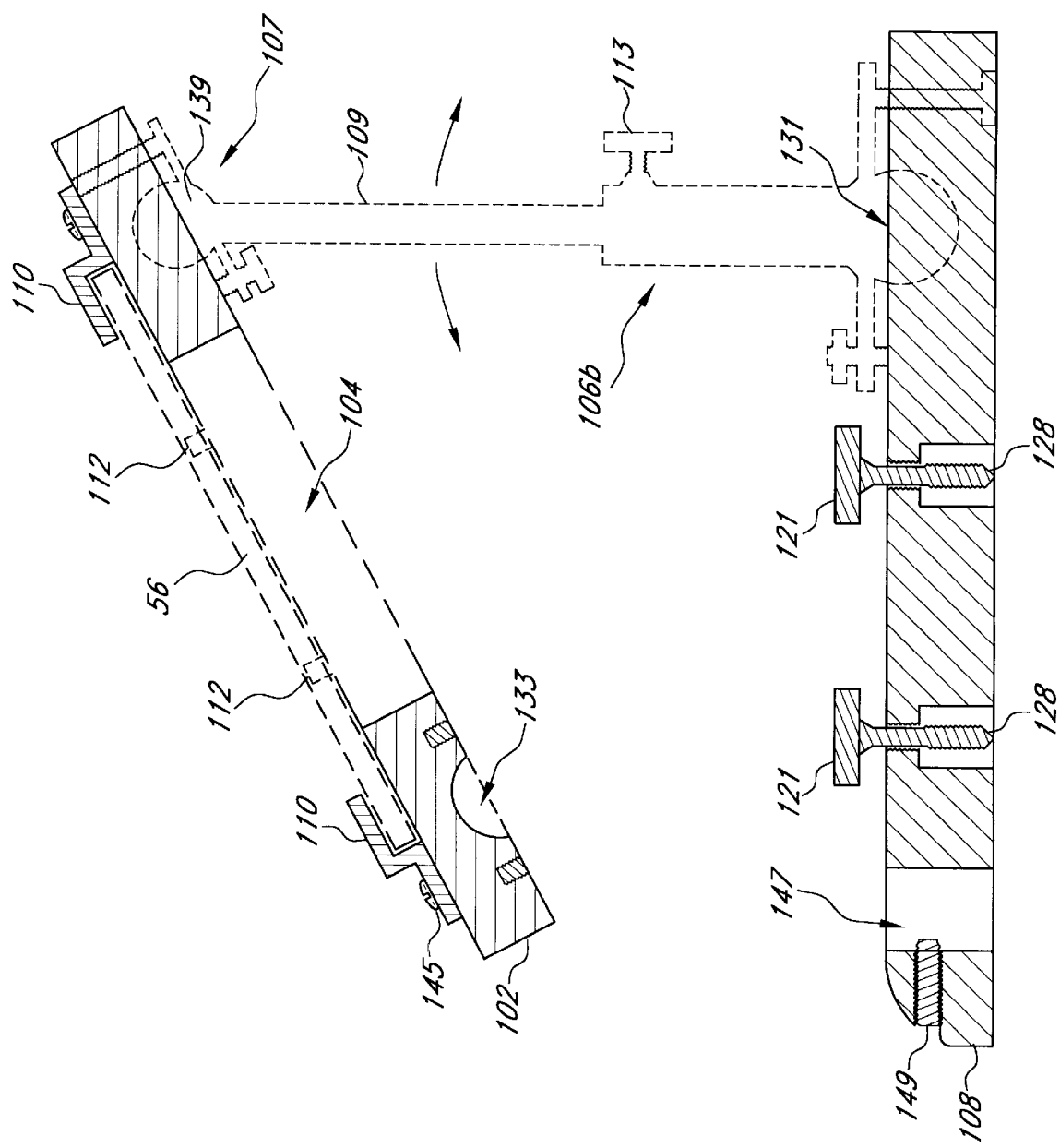
FIG. 6 is a crossectional illustration of the second embodiment of the invention, taken along line 6—6 of FIG. 5.

A second preferred embodiment of the present invention is shown in FIG. 5. In this embodiment, the front leg 106a is made readily removable so that the operator may gain additional access to the underside of the mounted wafer 50. A recess or hole 147 in the pedestal 108 (see FIGS. 5 and 6) receives the lower portion 111 of the front leg 106a. Referring now to FIG. 6, a set screw 149 or similar mechanism retains the lower portion 111 of the leg 106a in place when the leg is installed in the pedestal 108. Similarly, the joint thumbscrew 129 and threaded fastener 141 for the front leg 106a may be removed as shown in FIG. 6 to permit the upper ball portion 139 of the front leg 106a to disengage from its recess 133 so that the front leg may be removed in its entirety. In this manner, the top plate 102 is supported completely by the fully articulating rear legs 106b. The pedestal 108 and top plate 102 are designed and balanced so that when the rear legs 106b are at their maximum extension and rearward angle of inclination with respect to the vertical, and the forward unsupported end of the top plate 102 is fully rotated upward with respect to the rear legs, the handpick station 100 will remain stable and not tilt over backwards when sitting on a flat surface.

In the preferred embodiments described above, all of the components (with the exception of the nylon retaining balls 150) are fabricated from stainless steel due to its low rate of corrosion, superior mechanical strength, and other desirable properties. In this fashion, potential contamination of the wafer and die from corrosion products, flaking anti-corrosion coatings, or mechanical wear products is minimized. It should be recognized, however, that other materials may also be suitable for this application, consistent with the requirements of the user.

While the above detailed description has shown, described, and pointed out the fundamental novel features of the invention as applied to various embodiments, it will be understood that various omissions, substitutions, and changes in the form and details of the apparatus and processes illustrated may be made by those skilled in the art without departing from the spirit of the invention.

What is claimed is:

1. A wafer stand, comprising:

a pedestal;

a top plate having a substantially planar upper surface and an aperture extending through its thickness;

a plurality of supports each having a first end and a second end, said supports interposed between said pedestal and said top plate, said supports further having an adjustable telescoping portion and an articulated joint at both first and second ends; and a positioning mechanism for maintaining a wafer in proximity to said top plate and in relative alignment with said aperture.

2. The wafer stand of claim 1, wherein said top plate is sized to accommodate 200 mm silicon wafers mounted in wafer mount frames.

3. The wafer stand of claim 1, wherein the cross-section of said aperture is selected from the group of shapes including a circle, square, triangle, ellipse, rectangle, or polygon.

4. The wafer stand of claim 1, wherein said stand is portable.

5. The wafer stand of claim 1, wherein said pedestal includes a plurality of retaining mechanisms for mounting said wafer stand to a bench or table.

6. The wafer stand of claim 1, wherein said positioning mechanism comprises two substantially parallel tracks mounted on said top plate, and which maintains the wafer in an orientation which is substantially parallel to the upper surface of said top plate.

7. The wafer stand of claim 1, wherein said top plate, pedestal, and supports are stainless steel.

8. The wafer stand of claim 1, wherein one or more of said supports is removable.

9. A wafer stand, comprising:

a pedestal;

a top plate having a substantially planar upper surface and an aperture extending through its thickness;

a plurality of supports interposed between said pedestal and said top plate, said supports having adjustable ball-and-socket joints to permit movement of said top plate around one or more axes with respect to said pedestal; and a positioning mechanism for maintaining a wafer in proximity to said top plate and in relative alignment with said aperture.

10. The wafer stand of claim 9, wherein said stand is portable.

11. The wafer stand of claim 9, wherein said positioning mechanism comprises two substantially parallel tracks mounted on said top plate, and which maintains the wafer in an orientation which is substantially parallel to the upper surface of said top plate.

12. The wafer stand of claim 9, wherein one or more of said supports is removable.

13. A wafer stand, comprising:

a pedestal;

a top plate having a substantially planar upper surface and an aperture extending through its thickness;

a positioning mechanism for maintaining a wafer in proximity to said top plate and in relative alignment with said aperture, a plurality of supports interposed between said pedestal and said top plate; and one or more retaining mechanisms communicating with said top plate for limiting the lateral movement of said wafer while captured by said positioning mechanism.

14. The wafer stand of claim 13, wherein said retaining mechanism is a spring-loaded member recessed in said top plate so as to extend outwardly therefrom toward the wafer supported on said top plate.

15. The wafer stand of claim 13, wherein said retaining mechanism is a raised stop pin.

\* \* \* \* \*